United States Patent
Kashiwaya

(10) Patent No.: US 7,019,441 B2
(45) Date of Patent: Mar. 28, 2006

(54) PIEZOELECTRIC/ELECTROSTRICTIVE FILM TYPE DEVICE AND PIEZOELECTRIC/ELECTROSTRICTIVE PORCELAIN COMPOSITION

(75) Inventor: Toshikatsu Kashiwaya, Inazawa (JP)

(73) Assignee: NGK Insulators, Ltd., Nagoya (JP)

(*) Notice: Subject to any disclaimer, the term of this patent is extended or adjusted under 35 U.S.C. 154(b) by 159 days.

(21) Appl. No.: 10/797,991

(22) Filed: Mar. 11, 2004

(65) Prior Publication Data
US 2004/0189152 A1    Sep. 30, 2004

(30) Foreign Application Priority Data
Mar. 31, 2003 (JP) .............. 2003-096313

(51) Int. Cl.
*H01L 41/08* (2006.01)
(52) U.S. Cl. ........... 310/330; 310/324; 310/332; 310/358; 252/62.9 PZ
(58) Field of Classification Search ........ 310/324, 310/330–332, 328, 358, 311; 252/62.9 PZ
See application file for complete search history.

(56) References Cited

U.S. PATENT DOCUMENTS

| | | | | |
|---|---|---|---|---|
| 5,825,121 A | * | 10/1998 | Shimada | 310/358 |
| 6,091,183 A | * | 7/2000 | Nishimura et al. | 310/358 |
| 6,097,133 A | * | 8/2000 | Shimada et al. | 310/358 |
| 6,140,746 A | * | 10/2000 | Miyashita et al. | 310/358 |
| 6,198,208 B1 | * | 3/2001 | Yano et al. | 310/358 |
| 6,543,107 B1 | * | 4/2003 | Miyashita et al. | 29/25.35 |
| 6,552,474 B1 | * | 4/2003 | Takeuchi et al. | 310/330 |
| 6,583,688 B1 | * | 6/2003 | Klee et al. | 333/188 |
| 2004/0051422 A1 | | 3/2004 | Kashiwaya et al. | |

FOREIGN PATENT DOCUMENTS

| | | |
|---|---|---|
| JP | 44-17103 | 7/1969 |
| JP | 45-8145 | 3/1970 |
| JP | 06-191941 | 7/1994 |
| JP | 11-29357 | 2/1999 |
| JP | 2001-181033 | 7/2001 |

OTHER PUBLICATIONS

U.S. Appl. No. 11/001,952, filed Dec. 2, 2004, Kashiwaya et al.

* cited by examiner

*Primary Examiner*—Mark Budd
(74) *Attorney, Agent, or Firm*—Burr & Brown

(57) ABSTRACT

There is provided a piezoelectric/electrostrictive film type device comprising: a substrate formed of a ceramic, at least one piezoelectric/electrostrictive portion formed of a piezoelectric/electrostrictive porcelain composition on the substrate, and at least one pair of electrodes on the substrate, electrically connected to the piezoelectric/electrostrictive portion and including a positive electrode and a negative electrode. The piezoelectric/electrostrictive porcelain composition contains a $PbMg_{1/3}Nb_{2/3}O_3$—$PbZrO_3$—$PbTiO_3$ ternary solid solution system composition as a major component, and contains 0.05 to 3.0 wt % of NiO, and contains 2.0 to 22.0 mol % of Si with respect to the total number of moles of Mg and Ni. The piezoelectric/electrostrictive portion is solidly attached onto the substrate directly or via the positive electrode or the negative electrode.

16 Claims, 7 Drawing Sheets

US 7,019,441 B2

PIEZOELECTRIC/ELECTROSTRICTIVE FILM TYPE DEVICE AND PIEZOELECTRIC/ELECTROSTRICTIVE PORCELAIN COMPOSITION

This application claims the benefit of Japanese Application 2003-096313, filed Mar. 31, 2003, the entirety of which is incorporated herein by reference.

BACKGROUND OF THE INVENTION

1. Field of the Invention

The present invention relates to a piezoelectric/electrostrictive film type device, and a piezoelectric/electrostrictive porcelain composition constituting the device, particularly to a small-sized piezoelectric/electrostrictive film type device which includes a dense piezoelectric/electrostrictive portion having remarkably high piezoelectric characteristics, which is superior in vibration transmission properties between a substrate and the piezoelectric/electrostrictive portion, which is suitable for an actuator, a sensor, and the like, and which has high characteristics, and a piezoelectric/electrostrictive porcelain composition constituting the device.

2. Description of Related Art

A piezoelectric/electrostrictive film type device has heretofore been known as a device which can control a micro displacement in the order of submicrons. Especially, a piezoelectric/electrostrictive film type device including a piezoelectric/electrostrictive portion constituted of a piezoelectric/electrostrictive porcelain composition and an electrode portion to which a voltage is applied stacked on a substrate formed of a ceramic is suitable for the control of the micro displacement. Additionally, the device has superior characteristics such as a high electric/mechanical conversion efficiency, high-speed response, high durability, and small power consumption. Therefore, the device has been used in various applications such as a piezoelectric pressure sensor, a probe moving mechanism of a scanning type tunnel microscope, a rectilinear guide mechanism in an ultra-precision processing apparatus, a servo valve for a hydraulic control, a head of a VTR apparatus, a pixel constituting a flat panel type image display apparatus, and a head of an ink jet printer.

Moreover, the piezoelectric/electrostrictive porcelain composition constituting the piezoelectric/electrostrictive portion has variously been studied. For example, a $Pb(Mg_{1/3}Nb_{2/3})O_3$—$PbTiO_3$—$PbZrO_3$ ternary solid solution system composition, or a piezoelectric/electrostrictive porcelain composition in which a part of Pb of the composition is replaced with Sr, La, or the like has been disclosed (e.g., see Japanese Patent Publication Nos. 44-17103 and 45-8145). It has been expected that a piezoelectric/electrostrictive device including a piezoelectric/electrostrictive portion which has superior piezoelectric characteristics (e.g., piezoelectric d constant) and which is a most important element for determining the piezoelectric characteristics of the piezoelectric/electrostrictive device.

However, in the conventional piezoelectric/electrostrictive device, a piezoelectric/electrostrictive material constituted of the piezoelectric/electrostrictive porcelain composition is formed on the substrate, and then, they are thermally treated to manufacture the piezoelectric/electrostrictive device. Therefore, even if it is tried to make the piezoelectric/electrostrictive porcelain composition contract to be densified by the thermal treatment, the substrate does not easily contract, and therefore density of the piezoelectric/electrostrictive portion lowers. This has caused a problem of low flexural displacement or dielectric breakdown in a portion having a low density at the time of application of the voltage. Especially, in a multilayered piezoelectric/electrostrictive device, the problem is remarkable, and there has been a strong demand for solving the problem.

Under this situation, as the conventional piezoelectric/electrostrictive device, a device has been disclosed in which the piezoelectric/electrostrictive portion obtained by thermally treating the piezoelectric/electrostrictive material formed of the piezoelectric/electrostrictive porcelain composition beforehand is attached to the substrate to densify the piezoelectric/electrostrictive portion (e.g., see Japanese Patent Application Laid-Open No. 11-29357).

However, in this piezoelectric/electrostrictive device, an inorganic/organic adhesive needs to be used in attaching the piezoelectric/electrostrictive portion to the substrate. Therefore, the adhesive hampers vibration transmission between the substrate and the piezoelectric/electrostrictive portion, or adhesive components deteriorate characteristics of the piezoelectric/electrostrictive portion or the substrate in some cases.

Further, it has not been considered at all that composition of the piezoelectric/electrostrictive porcelain composition is varied depending on each piezoelectric/electrostrictive portion in constituting the conventional piezoelectric/electrostrictive device when it is multilayered, and sufficient piezoelectric/electrostrictive characteristics are not necessarily obtained.

On the other hand, the piezoelectric/electrostrictive material of a bulk member has heretofore been manufactured by firing a predetermined piezoelectric/electrostrictive porcelain composition under predetermined temperature conditions. However, the piezoelectric/electrostrictive material needs to be sinterd at a sufficiently high temperature (e.g., 1200° C. or more) in order to manufacture the piezoelectric/electrostrictive material having desired superior piezoelectric characteristics. Therefore, there have been problems in equipment, cost, and the like.

SUMMARY OF THE INVENTION

The present invention has been developed in consideration of the above-described problems of the prior art, and an object thereof is to provide a small-sized piezoelectric/electrostrictive film type device which includes a dense piezoelectric/electrostrictive portion having remarkably high piezoelectric characteristics and which is superior in vibration transmission properties between a substrate and the piezoelectric/electrostrictive portion and which is suitable for an actuator, a sensor, and the like and which has high characteristics, and a piezoelectric/electrostrictive porcelain composition capable of constituting a piezoelectric/electrostrictive portion densified even by thermal treatment at a low temperature and having high piezoelectric characteristics.

That is, according to the present invention, there is provided a piezoelectric/electrostrictive film type device (first aspect of the invention) comprising:

a substrate formed of a ceramic, at least one piezoelectric/electrostrictive portion formed of a piezoelectric/electrostrictive porcelain composition on the substrate, and at least one pair of electrodes on the substrate, electrically connected to the piezoelectric/electrostrictive portion and including a positive electrode and a negative electrode, wherein the piezoelectric/electrostrictive porcelain composition contains a $PbMg_{1/3}Nb_{2/3}O_3$—$PbZrO_3$—$PbTiO_3$ ternary solid solution system composition as a major component, contains 0.05 to 3.0 wt % of NiO, and contains 2.0 to 22.0 mol % of Si with respect to the total number of moles of Mg and Ni, and the piezoelectric/electrostrictive portion is solidly attached onto the substrate directly or via the positive electrode or the negative electrode.

In the present invention (first aspect of the invention), the piezoelectric/electrostrictive porcelain composition preferably comprises the $PbMg_{1/3}Nb_{2/3}O_3$—$PbZrO_3$—$PbTiO_3$ ternary solid solution system composition represented by the following general formula (7) as the major component:

$$Pb_x(Mg_{y/3}Nb_{2/3})_aTi_bZr_cO_3 \qquad (7),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c =1.00).

Moreover, according to the present invention, there is provided a piezoelectric/electrostrictive film type device (second aspect of the invention) comprising:

a substrate formed of a ceramic, at least one piezoelectric/electrostrictive portion formed of a piezoelectric/electrostrictive porcelain composition on the substrate, and at least one pair of electrodes on the substrate, electrically connected to the piezoelectric/electrostrictive portion and including a positive electrode and a negative electrode, wherein the piezoelectric/electrostrictive porcelain composition contains a $Pb(Mg, Ni)_{1/3}Nb_{2/3}O_3$—$PbZrO_3$—$PbTiO_3$ ternary solid solution system composition as a major component, and contains 4.0 to 37.0 mol % of Si with respect to the total number of moles of Mg and Ni, and the piezoelectric/electrostrictive portion is solidly attached onto the substrate directly or via the positive electrode or the negative electrode.

In the present invention (second aspect of the invention), the piezoelectric/electrostrictive porcelain composition preferably comprises the $Pb(Mg, Ni)_{1/3}Nb_{2/3}O_3$—$PbZrO_3$—$PbTiO_3$ ternary solid solution system composition represented by the following general formula (8) as the major component:

$$Pb_x\{(Mg_{1-y}Ni_y)_{(1/3)xa}Nb_{2/3}\}_bTi_cZr_dO_3 \qquad (8),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

In the present invention (first and second aspects of the invention), the device preferably comprises: a plurality of piezoelectric/electrostrictive portions; and a plurality of pairs of electrodes. The plurality of piezoelectric/electrostrictive portions are alternately held/stacked via the positive electrodes and the negative electrodes of the plurality of pairs of electrodes. One piezoelectric/electrostrictive portion has a thickness of 1 to 10 μm.

Moreover, according to the present invention, there is provided a piezoelectric/electrostrictive film type device (third invention) comprising:

a substrate formed of a ceramic, a plurality of piezoelectric/electrostrictive portions formed of a piezoelectric/electrostrictive porcelain composition on the substrate, and a plurality of pairs of electrodes on the substrate, each electrically connected to the piezoelectric/electrostrictive portion and each including a positive electrode and a negative electrode. The plurality of piezoelectric/electrostrictive portions are alternately held/stacked via the positive electrodes and negative electrodes of the plurality of pairs of electrodes. In the device, the piezoelectric/electrostrictive porcelain composition constituting at least one piezoelectric/ electrostrictive portion (first piezoelectric/electrostrictive portion) contains a $Pb(Mg, Ni)_{1/3}Nb_{2/3}O_3$—$PbZrO_3$—$PbTiO_3$ ternary solid solution system composition as a major component, and contains 4.0 to 37.0 mol % of Si with respect to the total number of moles of Mg and Ni. The piezoelectric/electrostrictive porcelain composition constituting at least one piezoelectric/electrostrictive portion (second piezoelectric/electrostrictive portion) contains a $PbMg_{1/3}Nb_{2/3}O_3$—$PbZrO_3$—$PbTiO_3$ ternary solid solution system composition as the major component, contains 0.05 to 3.0 wt % of NiO, and contains 2.0 to 22.0 mol % of Si with respect to the total number of moles of Mg and Ni.

In the present invention (third invention), the piezoelectric/electrostrictive porcelain composition constituting the second piezoelectric/electrostrictive portion preferably comprises the $PbMg_{1/3}Nb_{2/3}O_3$—$PbZrO_3$—$PbTiO_3$ ternary solid solution system composition represented by the following general formula (9) as the major component. The piezoelectric/electrostrictive porcelain composition constituting the first piezoelectric/electrostrictive portion comprises the $Pb(Mg, Ni)_{1/3}Nb_{2/3}O_3$—$PbZrO_3$—$PbTiO_3$ ternary solid solution system composition represented by the following general formula (10) as the major component.

$$Pb_x(Mg_{y/3}Nb_{2/3})_aTi_bZr_cO_3 \qquad (9),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

$$Pb_x\{(Mg_{1-y}Ni_y)_{(1/3)xa}Nb_{2/3}\}_bTi_cZr_dO_3 \qquad (10),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475); (0.100, 0.525, 0.375), (0.375, 0.425, 0.200) in coordinates in which b, c, d are coordinate axes (additionally, (b+c+d)=1.000).

In the present invention (third invention), each of the plurality of piezoelectric/electrostrictive portions preferably has a thickness of 1 to 10 μm. An Ni content of the piezoelectric/electrostrictive porcelain composition constituting the piezoelectric/electrostrictive portion of a lowermost layer is preferably smaller than that of the piezoelectric/electrostrictive porcelain composition constituting the piezoelectric/electrostrictive portion other than that of the lowermost layer.

Moreover, according to the present invention, there is provided a piezoelectric/electrostrictive porcelain composition (fourth aspect of the invention) comprising: a $PbMg_{1/3}Nb_{2/3}O_3$—$PbZrO_3$—$PbTiO_3$ ternary solid solution system composition as a major component; 0.05 to 3.0 wt % of NiO; and 2.0 to 22.0 mol % of Si with respect to the total number of moles of Mg and Ni.

In the present invention (fourth aspect of the invention), the composition preferably comprises: the $PbMg_{1/3}Nb_{2/3}$ $O_3$—$PbZrO_3$—$PbTiO_3$ ternary solid solution system composition represented by the following general formula (11) as the major component:

$$Pb_x(Mg_{y/3}Nb_{2/3})_aTi_bZr_cO_3 \quad (11),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

Moreover, according to the present invention, there is provided a piezoelectric/electrostrictive porcelain composition (fifth aspect of the invention) comprising: a Pb(Mg, Ni)$_{1/3}$Nb$_{2/3}$O$_3$—PbZrO$_3$—PbTiO$_3$ ternary solid solution system composition as a major component; and 4.0 to 37.0 mol % of Si with respect to the total number of moles of Mg and Ni.

In the present invention (fifth aspect of the invention), the composition preferably comprises: the Pb(Mg, Ni)$_{1/3}$Nb$_{2/3}$O$_3$—PbZrO$_3$—PbTiO$_3$ ternary solid solution system composition represented by the following general formula (12) as the major component:

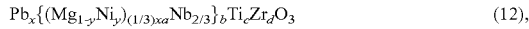
$$Pb_x\{(Mg_{1-y}Ni_y)_{(1/3)xa}Nb_{2/3}\}_bTi_cZr_dO_3 \quad (12),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

BRIEF DESCRIPTION OF THE DRAWINGS

FIG. 5(a) is a top plan view, and FIG. 5(b) is a sectional view;

DESCRIPTION OF THE PREFERRED EMBODIMENT

Embodiments of the present invention will hereinafter specifically be described with reference to the drawings. It would be understood that the present invention is not limited to the following embodiments, and is appropriately be changed or improved in design based on usual knowledge of a person skilled in the art within the scope of the present invention.

Figure 1:
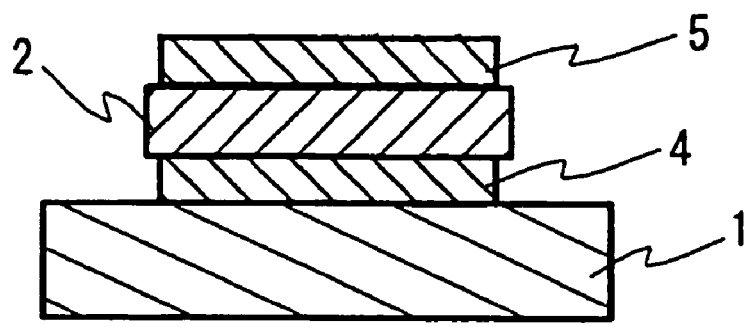
FIG. 1 is a sectional view schematically showing one embodiment of a piezoelectric/electrostrictive film type device of the present invention.

As shown in FIG. 1, a piezoelectric/electrostrictive film type device of an embodiment of the present invention (first aspect of the invention) includes at least one piezoelectric/electrostrictive portion 2 formed of a piezoelectric/electrostrictive porcelain composition and at least one pair of electrodes 4, 5 electrically connected to the piezoelectric/electrostrictive portion 2 and including positive and negative electrodes on a substrate 1 formed of a ceramic.

The piezoelectric/electrostrictive porcelain composition constituting the piezoelectric/electrostrictive portion 2 of the piezoelectric/electrostrictive film type device of the present embodiment contains a PbMg$_{1/3}$Nb$_{2/3}$O$_3$—PbZrO$_3$—PbTiO$_3$ ternary solid solution system composition as a major component, and contains 0.05 to 3.0 wt % of NiO. That is, the piezoelectric/electrostrictive portion 2 is constituted of the piezoelectric/electrostrictive porcelain composition containing the PbMg$_{1/3}$Nb$_{2/3}$O$_3$—PbZrO$_3$—PbTiO$_3$ ternary solid solution system composition as the major component to which a predetermined ratio of NiO is added. Therefore, in this piezoelectric/electrostrictive portion 2, a hetero-phase is inhibited from being formed, a perovskite phase which contributes to a flexural displacement accounts for a large ratio, and piezoelectric characteristics due to the characteristics of the composition are enhanced. It is to be noted that, in the present embodiment, the piezoelectric/electrostrictive porcelain composition contains preferably 0.10 to 2.5wt %, more preferably 0.15 to 2.0 wt % of NiO so as to further inhibit the hetero-phase from being formed in the piezoelectric/electrostrictive portion 2.

Moreover, in the piezoelectric/electrostrictive film type device of the present embodiment, the piezoelectric/electrostrictive portion 2 is constituted of an Si-containing piezoelectric/electrostrictive porcelain composition. A raw material mixture (piezoelectric material) mixed so as to constitute the piezoelectric/electrostrictive porcelain composition having a predetermined composition is sintered in a state that silica (SiO$_2$) is further added thereto to form the piezoelectric/electrostrictive portion 2. It is supposed that SiO$_2$ has a function of reacting with Pb in the piezoelectric material to form a low-melting glass phase so that the obtained piezoelectric/electrostrictive porcelain composition is densified.

Moreover, SiO$_2$ reacts with Ni, Mg, and the like in the piezoelectric material to form a compound such as Ni$_2$SiO$_4$. Therefore, in the piezoelectric/electrostrictive film type device of the present embodiment, since a decrease of Pb from a perovskite structure is suppressed, and a deviation from a stoichiometric composition is small, the piezoelectric/electrostrictive portion 2 is densified, and the flexural displacement is remarkably large.

Especially, the piezoelectric/electrostrictive porcelain composition constituting the piezoelectric/electrostrictive portion 2 of the piezoelectric/electrostrictive film type device of the present embodiment contains 2.0 to 22.0 mol % of Si with respect to the total number of moles of Mg and Ni. When an Si content exceeds 22.0 mol %, while the composition is densified, an excessive amount of compound such as $Ni_2SiO_4$ which does not indicate piezoelectric characteristics is generated. Therefore, the piezoelectric characteristics of the piezoelectric/electrostrictive portion 2 unfavorably drop. When the Si content is less than 2.0 mol %, a densifying effect by the content of Si is hardly exhibited, which is unfavorable. It is to be noted that, to enhance denseness and to prevent the piezoelectric characteristics of the piezoelectric/electrostrictive portion 2 from dropping, the piezoelectric/electrostrictive porcelain composition contains preferably 3.0 to 21.0 mol %, and more preferably 3.9 to 19.8 mol % of Si with respect to the total number of moles of Mg and Ni.

Moreover, in the present embodiment, it is preferred that the piezoelectric/electrostrictive porcelain composition comprises the $PbMg_{1/3}Nb_{2/3}O_3$—$PbZrO_3$—$PbTiO_3$ ternary solid solution system composition represented by the following general formula (13) as the major component so as to have high piezoelectric characteristics.

$$Pb_x(Mg_{y/3}Nb_{2/3})_aTi_bZr_cO_3 \quad (13),$$

where $0.95 \leq x \leq 1.05$, $0.8 \leq y \leq 1.0$, and a, b, c are decimal numbers in a range surrounded with (a, b, c)= (0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

Next, an embodiment of the present invention (second aspect of the invention) will be described. In the same manner as in the embodiment of the first aspect of the invention, the piezoelectric/electrostrictive film type device which is the embodiment of the second aspect of the invention includes at least one piezoelectric/electrostrictive portion 2 formed of the piezoelectric/electrostrictive porcelain composition, and at least one pair of electrodes 4, 5 electrically connected to the piezoelectric/electrostrictive portion 2 and including the positive and negative electrodes on the substrate 1 formed of the ceramic as shown in FIG. 1.

The piezoelectric/electrostrictive porcelain composition constituting the piezoelectric/electrostrictive portion 2 of the piezoelectric/electrostrictive film type device of the present embodiment contains a $Pb(Mg, Ni)_{1/3}Nb_{2/3}O_3$—$PbZrO_3$—$PbTiO_3$ ternary solid solution system composition as the major component. This $Pb(Mg, Ni)_{1/3}Nb_{2/3}O_3$—$PbZrO_3$—$PbTiO_3$ ternary solid solution system composition is obtained by replacing a part of Mg in a $Pb(Mg_{1/3}Nb_{2/3})O_3$—$PbTiO_3$—$PbZrO_3$ ternary solid solution system composition with Ni. Since a part of Mg is replaced with Ni, formation of hetero-phase is suppressed in the piezoelectric/electrostrictive portion 2, and the ratio accounted for by the perovskite phase contributing to the flexural displacement is large. Therefore, the piezoelectric characteristics due to the characteristics of the composition are enhanced.

Moreover, the piezoelectric/electrostrictive porcelain composition constituting the piezoelectric/electrostrictive portion 2 of the piezoelectric/electrostrictive film type device of the present embodiment contains 4.0 to 37.0 mol % of Si with respect to the total number of moles of Mg and Ni. When the Si content exceeds 37.0 mol %, while the composition is densified, the excessive amount of compound such as $Ni_2SiO_4$ which does not indicate the piezoelectric characteristics is generated. Therefore, the piezoelectric characteristics of the piezoelectric/electrostrictive portion 2 unfavorably drop. When the Si content is less than 4.0 mol %, the densifying effect by the content of Si is hardly exhibited, which is unfavorable. It is to be noted that, to enhance denseness and to prevent the piezoelectric characteristics of the piezoelectric/electrostrictive portion 2 from dropping, the piezoelectric/electrostrictive porcelain composition contains preferably 5.5 to 34.0 mol %, and more preferably 6.6 to 32.8 mol % of Si with respect to the total number of moles of Mg and Ni.

Moreover, in the present embodiment, it is preferred that the piezoelectric/electrostrictive porcelain composition comprises the $Pb(Mg, Ni)_{1/3}Nb_{2/3}O_3$—$PbZrO_3$—$PbTiO_3$ ternary solid solution system composition represented by the following general formula (14) as the major component so as to have high piezoelectric characteristics.

$$Pb_x\{(Mg_{1-y}Ni_y)_{(1/3)xa}Nb_{2/3}\}_bTi_cZr_dO_3 \quad (14),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

Moreover, in the piezoelectric/electrostrictive film type device (see FIG. 1) which is the embodiment of the present invention (first and second aspect of the inventions), the piezoelectric/electrostrictive portion 2 constituting the device is solidly attached to the substrate 1 directly or via the positive or negative electrode (electrode 4) described below. Therefore, the drop of vibration transmitting properties between the substrate 1 and the piezoelectric/electrostrictive portion 2 due to the presence of an adhesive or the like, and deterioration of the characteristics of the piezoelectric/electrostrictive portion 2 or the substrate 1 by an influence of adhesive components can be avoided. It is to be noted that the "be solidly attached" means that the piezoelectric/electrostrictive portion 2 is tightly integrated with the substrate 1 or the electrode 4 by a solid phase reaction without using any organic or inorganic adhesive.

Figure 3:
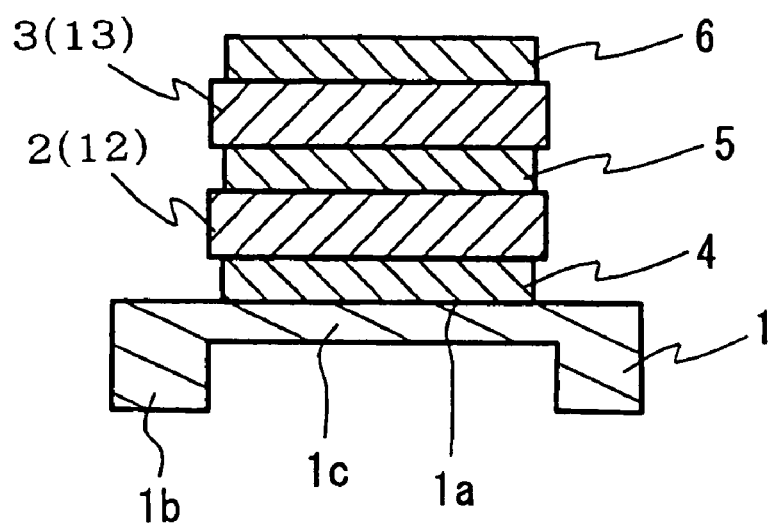
FIG. 3 is a sectional view schematically showing still another embodiment of a piezoelectric/electrostrictive film type device of the present invention.

In the piezoelectric/electrostrictive film type device which is the embodiment of the present invention (first and second aspect of the inventions), as shown in FIG. 3, the device may also be constituted of a plurality of piezoelectric/electrostrictive portions 2, 3, and a plurality of pairs of electrodes 4, 5, 6 so that the plurality of piezoelectric/electrostrictive portions 2, 3 may alternately be held/stacked via the positive and negative electrodes of the plurality of pairs of electrodes 4, 5, 6.

Moreover, in the piezoelectric/electrostrictive film type device (see FIG. 1) of the embodiment of the present invention (first and second aspect of the inventions), one piezoelectric/electrostrictive portion (piezoelectric/electrostrictive portion 2) has a thickness of preferably 1 to 10 μm, more preferably 2 to 9 μm, and especially preferably 3 to 8 μm. When the thickness of the piezoelectric/electrostrictive portion 2 is less than 1 μm, even the piezoelectric/electrostrictive portion formed of the aforementioned predetermined piezoelectric/electrostrictive porcelain composition is insufficiently densified. On the other hand, when the thickness of the piezoelectric/electrostrictive portion 2 exceeds 10 μm, a thicker ceramic substrate is required so as to prevent the substrate from being destroyed. Eventually, it is difficult to cope with miniaturization.

Next, an embodiment of the present invention (third invention) will be described. As shown in FIG. 3, the piezoelectric/electrostrictive film type device of the embodiment of the third invention includes a plurality of piezoelectric/electrostrictive portions 2, 3 formed of the piezoelectric/electrostrictive porcelain composition, and a plurality of pairs of electrodes 4, 5, 6 electrically connected to the piezoelectric/electrostrictive portions 2, 3 on the substrate 1 formed of the ceramic, and the piezoelectric/electrostrictive portions 2, 3 are alternately held/stacked via the positive and negative electrodes of the electrodes 4, 5, 6.

In the piezoelectric/electrostrictive film type device of the present embodiment, the piezoelectric/electrostrictive porcelain composition constituting at least one piezoelectric/electrostrictive portion (first piezoelectric/electrostrictive portion 12) among a plurality of piezoelectric/electrostrictive portion 2,3 contains a Pb(Mg, Ni)$_{1/3}$Nb$_{2/3}$O$_3$—PbZrO$_3$—PbTiO$_3$ ternary solid solution system composition as the major component. Therefore, in the same manner as in the second aspect of the invention, formation of the hetero-phase is suppressed in the first piezoelectric/electrostrictive portion 12, the ratio accounted for the perovskite phase which contributes to the flexural displacement is large, and the piezoelectric characteristics due to the characteristics of the composition are enhanced.

Moreover, the piezoelectric/electrostrictive porcelain composition constituting the first piezoelectric/electrostrictive portion 12 contains 4.0 to 37.0 molt % of Si with respect to the total number of moles of Mg and Ni. Therefore, in the present-embodiment piezoelectric/electrostrictive film type device, in the same manner as in the second aspect of the invention, the decrease of Pb from the perovskite structure is suppressed, and therefore the first piezoelectric/electrostrictive portion 12 is densified, and the flexural displacement is remarkably large. When the Si content exceeds 37.0 mol %, while the composition is densified, the excessive amount of compound such as Ni$_2$SiO$_4$ which does not indicate the piezoelectric characteristics is generated. Therefore, the piezoelectric characteristics of the first piezoelectric/electrostrictive portion 12 unfavorably drop. When the Si content is less than 4.0 mol %, the densifying effect by the content of Si is hardly exhibited, which is unfavorable. It is to be noted that, to enhance denseness and to prevent the piezoelectric characteristics of the first piezoelectric/electrostrictive portion 12 from dropping, the piezoelectric/electrostrictive porcelain composition contains preferably 5.5 to 34.0 mol %, and more preferably 6.6 to 32.8 mol % of Si with respect to the total number of moles of Mg and Ni.

Moreover, the piezoelectric/electrostrictive porcelain composition constituting at least one piezoelectric/electrostrictive portion (second piezoelectric/electrostrictive portion 13) other than the first piezoelectric/electrostrictive portion 12 contains a PbMg$_{1/3}$Nb$_{2/3}$O$_3$—PbZrO$_3$—PbTiO$_3$ ternary solid solution system composition as the major component, contains 0.05 to 3.0 wt % of NiO, and contains 2.0 to 22.0 mol % of Si with respect to the total number of moles of Mg and Ni.

Therefore, in the present-embodiment piezoelectric/electrostrictive film type device, in the same manner as in the first aspect of the invention, since the decrease of Pb from the perovskite structure is suppressed, the second piezoelectric/electrostrictive portion 13 is densified, and the flexural displacement is remarkably large. When the Si content exceeds 22.0 mol %, while the composition is densified, the excessive amount of compound such as Ni$_2$SiO$_4$ which does not indicate piezoelectric characteristics is generated. Therefore, the piezoelectric characteristics of the second piezoelectric/electrostrictive portion 13 unfavorably drop. When the Si content is less than 2.0 mol %, the densifying effect by the content of Si is hardly exhibited, which is unfavorable. It is to be noted that, to enhance denseness and to prevent the piezoelectric characteristics of the second piezoelectric/electrostrictive portion 13 from dropping, the piezoelectric/electrostrictive porcelain composition contains preferably 3.0 to 21.0 mol %, and more preferably 3.9 to 19.8 mol % of Si with respect to the total number of moles of Mg and Ni.

It is to be noted that in FIG. 3, a lower-layer side (substrate 1 side) is shown as the first piezoelectric/electrostrictive portion 12, and an upper-layer side is shown as the second piezoelectric/electrostrictive portion 13, but the present invention is not limited to this forming order. That is, the lower-layer side closer to the substrate 1 may be the second piezoelectric/electrostrictive portion, and the upper-layer side may be the first piezoelectric/electrostrictive portion. However, when the lower-layer side is constituted of the first piezoelectric/electrostrictive portion 12 and the upper-layer side is constituted of the second piezoelectric/electrostrictive portion 13, as shown in FIG. 3, the piezoelectric characteristics are preferably higher. Furthermore, the piezoelectric/electrostrictive portion constituted of the different piezoelectric/electrostrictive porcelain composition may similarly preferably be constituted of three or more layers.

Moreover, in the present embodiment, it is preferred that the piezoelectric/electrostrictive porcelain composition constituting the second piezoelectric/electrostrictive portion 13 comprises the PbMg$_{1/3}$Nb$_{2/3}$O$_3$—PbZrO$_3$—PbTiO$_3$ ternary solid solution system composition represented by the following general formula (15) as the major component and that the piezoelectric/electrostrictive porcelain composition constituting the first piezoelectric/electrostrictive portion 12 comprises the Pb(Mg, Ni)$_{1/3}$Nb$_{2/3}$O$_3$—PbZrO$_3$—PbTiO$_3$ ternary solid solution system composition represented by the following general formula (16) as the major component so as to have high piezoelectric characteristics.

$$Pb_x(Mg_{y/3}Nb_{2/3})_aTi_bZr_cO_3 \quad (15),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

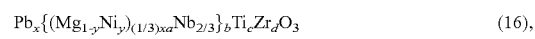

$$Pb_x\{(Mg_{1-y}Ni_y)_{(1/3)xa}Nb_{2/3}\}_bTi_cZr_dO_3 \quad (16),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

It is to be noted that in the piezoelectric/electrostrictive film type device (see FIG. 3) of the embodiment of the present invention (third invention), each of the plurality of piezoelectric/electrostrictive portions (first piezoelectric/electrostrictive portion 12, second piezoelectric/electrostrictive portion 13) has a thickness of preferably 1 to 10 μm, further preferably 2 to 9 μm, and especially preferably 3 to 8 μm. When the thickness is less than 1 μm, even the piezoelectric/electrostrictive portion formed of the aforementioned predetermined piezoelectric/electrostrictive porcelain composition is insufficiently densified. On the other hand, when the thickness exceeds 10 μm, the thicker ceramic substrate is required so as to prevent the substrate from being destroyed. Eventually, it is difficult to cope with the miniaturization.

Moreover, in the piezoelectric/electrostrictive film type device (see FIG. 3) of the embodiment of the present invention (third invention), an Ni content of the piezoelectric/electrostrictive porcelain composition constituting the piezoelectric/electrostrictive portion of the lowermost layer (first piezoelectric/electrostrictive portion 12) is preferably smaller than that of the piezoelectric/electrostrictive porcelain composition constituting the piezoelectric/electrostrictive portion other than the second piezoelectric/electrostrictive portion 13. Accordingly, in the first piezoelectric/electrostrictive portion 12, formation of the hetero-phase is suppressed, the ratio accounted for the perovskite phase which contributes to the flexural displacement is large, and the piezoelectric characteristics are enhanced due to the characteristics of the composition itself. Additionally, in the piezoelectric/electrostrictive portions corresponding to and after the second piezoelectric/electrostrictive portion 13 which contain a larger amount of Ni, a restriction on the substrate 1 concerning sintering contraction is small, and the effect of the content of Ni remarkably appears. Therefore, the piezoelectric/electrostrictive portions including and after the second piezoelectric/electrostrictive portion 13 are much densified by the thermal treatment in the manufacturing process, and the adjacent first piezoelectric/electrostrictive portion 12 is also densified due to the influence. As a result, there can be provided the piezoelectric/electrostrictive film type device which has higher piezoelectric characteristics together with the characteristics of the porcelain composition.

In the present invention, to enhance denseness and to suppress formation of the hetero-phase in the second piezoelectric/electrostrictive portion 13, the piezoelectric/electrostrictive porcelain composition contains preferably 0.10 to 2.5wt %, and more preferably 0.15 to 2.0 wt % of NiO. Moreover, in the present invention, a ratio (first/second) of the Ni content of the first piezoelectric/electrostrictive portion 12 to that of the second piezoelectric/electrostrictive portion 13 is preferably 0.07 to 0.35, further preferably 0.10 to 0.33, especially preferably 0.12 to 0.30. When the value of (first/second) is less than 0.07, the hetero-phase in the second piezoelectric/electrostrictive portion 13 is easily enlarged, and therefore the whole piezoelectric characteristics are easily reduced. On the other hand, when the value exceeds 0.35, a degree of densification in the second piezoelectric/electrostrictive portion 13 becomes small. Therefore, also the first piezoelectric/electrostrictive portion 12 is not densified, and the whole piezoelectric characteristics are easily reduced. It is to be noted that even when three or more layers of piezoelectric/electrostrictive portions are disposed, the above-described NiO content of the second piezoelectric/electrostrictive portion is preferable from a relation with the first piezoelectric/electrostrictive portion. To further promote the densifying of each piezoelectric/electrostrictive portion, it is preferred the NiO contents of the third and subsequent piezoelectric/electrostrictive portions are the same as or larger than the content of the second piezoelectric/electrostrictive portion.

In the piezoelectric/electrostrictive film type device of the present invention (first to third aspect of the invention), the substrate is formed a ceramic, and the type of the ceramic is not especially limited. However, from the standpoints of heat resistance, chemical stability, and insulating properties, the substrate is preferably constituted of a ceramic including at least one selected from the group consisting of stabilized zirconium oxide, aluminum oxide, magnesium oxide, mullite, aluminum nitride, silicon nitride, and glass. Above all, stabilized zirconium oxide is further preferable because it is large in mechanical strength and superior in tenacity. It is to be noted that "stabilized zirconium oxide" mentioned in the present invention indicates zirconium oxide in which phase transition of crystals is inhibited by addition of a stabilizer, and not only stabilized zirconium oxide, but also partially stabilized zirconium oxide is included.

As stabilized zirconium oxide,there can be mentioned those containing a stabilizer such as calcium oxide, magnesium oxide, yttrium oxide, scandium oxide, ytterbium oxide, cerium oxide, and oxide of a rare earth metal, in an amount of 1 to 30 mol %. Above all, the stabilized zirconium oxide preferably contains yttrium oxide as the stabilizer because the mechanical strength of a vibrating portion would become especially high. In this case, the stabilized zirconium oxide contains preferably 1.5 to 6 mol %, further preferably 2 to 4 mol %, of yttrium oxide. Furthermore, the atabilized zirconium oxide preferably contains 0.1 to 5 mol % of aluminum oxide. A crystal phase of stabilized zirconium oxide may be a mixed phase of cubic system+monoclinic system, a mixed phase of tetragonal system+monoclinic system, or a mixed phase of cubic system+tetragonal system+monoclinic system. However, a crystal phase including a tetragonal system or a mixed phase of the tetragonal system+cubic system as the main phase is preferable from the standpoints of strength, tenacity, and durability.

It is to be noted that the thickness of the substrate is preferably 1 μm to 1 mm, further preferably 1.5 to 500 μm, and especially preferably 2 to 200 μm. When the thickness of the substrate is less than 1 μm, the mechanical strength of the piezoelectric/electrostrictive device is sometimes weakened. With the thickness exceeding 1 mm, a rigidity of the substrate against a contraction stress of the piezoelectric/electrostrictive portion increases and the flexural displacement of the piezoelectric device decreases when the voltage is applied to the piezoelectric/electrostrictive device.

Figure 2:
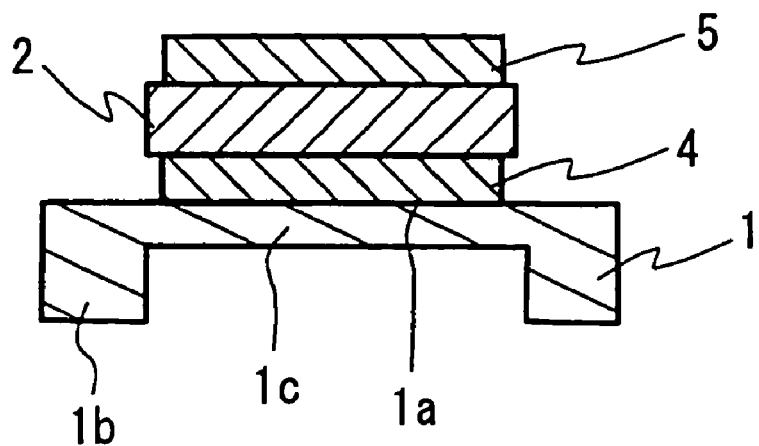
FIG. 2 is a sectional view schematically showing another embodiment of a piezoelectric/electrostrictive film type device of the present invention.
Figure 4:
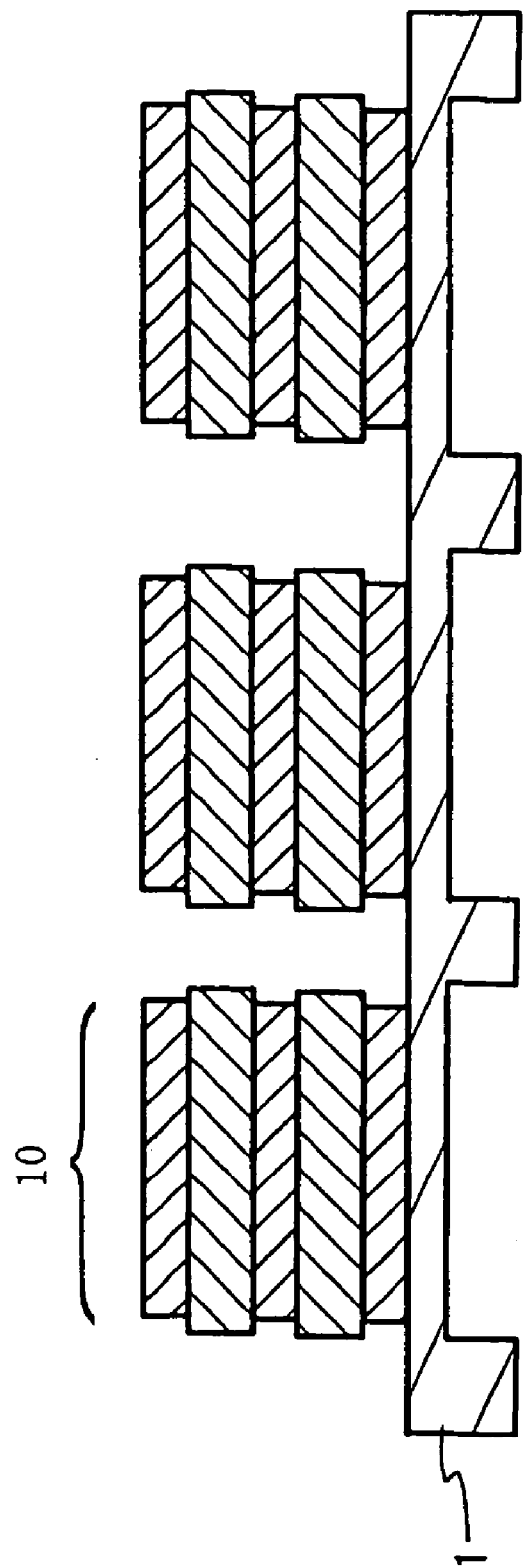
FIG. 4 is a sectional view schematically showing still another embodiment of a piezoelectric/electrostrictive film type device of the present invention.

Additionally, as shown in FIG. 2, the substrate 1 may include a thin portion 1c which is disposed in a region substantially corresponding to a solidly attached interface 1a to the piezoelectric/electrostrictive portion 2 (an example of the electrode 4 solidly attached to the substrate 1 is shown in FIG. 2) or to the electrode 4 and which has the above-described thickness, and a thick portion 1b which is disposed in a region substantially corresponding to a portion other than the solidly attached interface 1a and which is thicker than the thin portion 1c. This can increase the flexural displacement of the piezoelectric/electrostrictive film type device and the mechanical strength. As shown in FIG. 4, these structural units may be arranged on one substrate 1, and the substrate 1 can be shared by a plurality of piezoelectric/electrostrictive device units 10.

A surface shape of the substrate in the present invention (shape of the surface to which the electrode 4 is solidly attached in FIG. 1) is not especially limited, and the examples of the surface shape include rectangle, square, triangle, ellipse, perfect circle, rounded square, rounded rectangle, or a composite shape obtained by combining these shapes. The shape of the substrate itself is not especially limited, and the substrate may have a capsule shape including an appropriate inner space.

Figure 7:
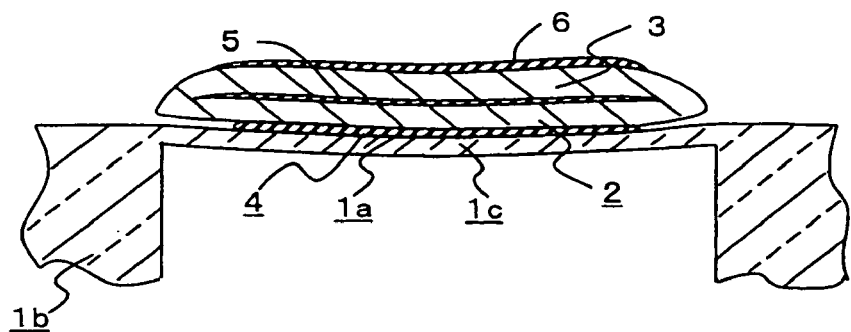
FIG. 7 is a sectional view showing another more specific example of the embodiment shown in FIG. 3.
Figure 8:
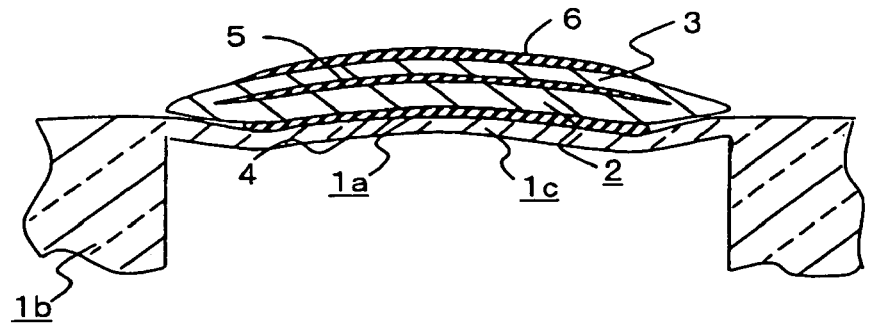
FIG. 8 is a sectional view showing still another more specific example of the embodiment shown in FIG. 3.

Moreover, the sectional shape of the thin portion of the substrate is preferably a shape bent on a side opposite to a surface whose middle part has the piezoelectric/electrostrictive portions 2, 3 as shown in FIG. 7, or a W shape in which a sectional shape in a thickness direction has three inflection points as shown in FIG. 8, because linearity of the flexural displacement against an electric field is high. It is to be noted that the bent shape shown in FIG. 7 can be formed by using contraction of the respective piezoelectric/electrostrictive portions 2, 3 in a thermal treatment step. The W shape shown in FIG. 8 can be formed by adjusting the contraction-start timings and the contraction amount of the piezoelectric/electrostrictive portions 2, 3 upon being sintered and the shape of the thin portion 1c.

In the present invention, the electrode is electrically connected to the piezoelectric/electrostrictive portion. When two or more piezoelectric/electrostrictive portions are disposed, the electrode is disposed between the piezoelectric/electrostrictive portions. With the electrode being disposed in this manner, especially when the Ni content of the piezoelectric/electrostrictive porcelain composition constituting the piezoelectric/electrostrictive portion of the lowermost layer is smaller than that of the piezoelectric/electrostrictive porcelain composition constituting the piezoelectric/electrostrictive portion other than that of the lowermost layer, the disposed electrode also functions as an Ni movement barrier. This electrode effectively prevents hetero-phase from being formed by transition of Ni to the piezoelectric/electrostrictive portion having a lower Ni content from the piezoelectric/electrostrictive portion having a higher Ni content.

Therefore, in the present invention, the electrode is preferably disposed in a state in which a region substantially contributing to the flexural displacement of the piezoelectric/electrostrictive portion is included. For example, as shown in FIG. 3, the electrodes 4, 5, 6 are preferably disposed in an 80% or more area of a region including the vicinity of the middle part of the surface on which the first piezoelectric/electrostrictive portion 12 and second piezoelectric/electrostrictive portion 13 are formed.

Figures 5A, 5B:
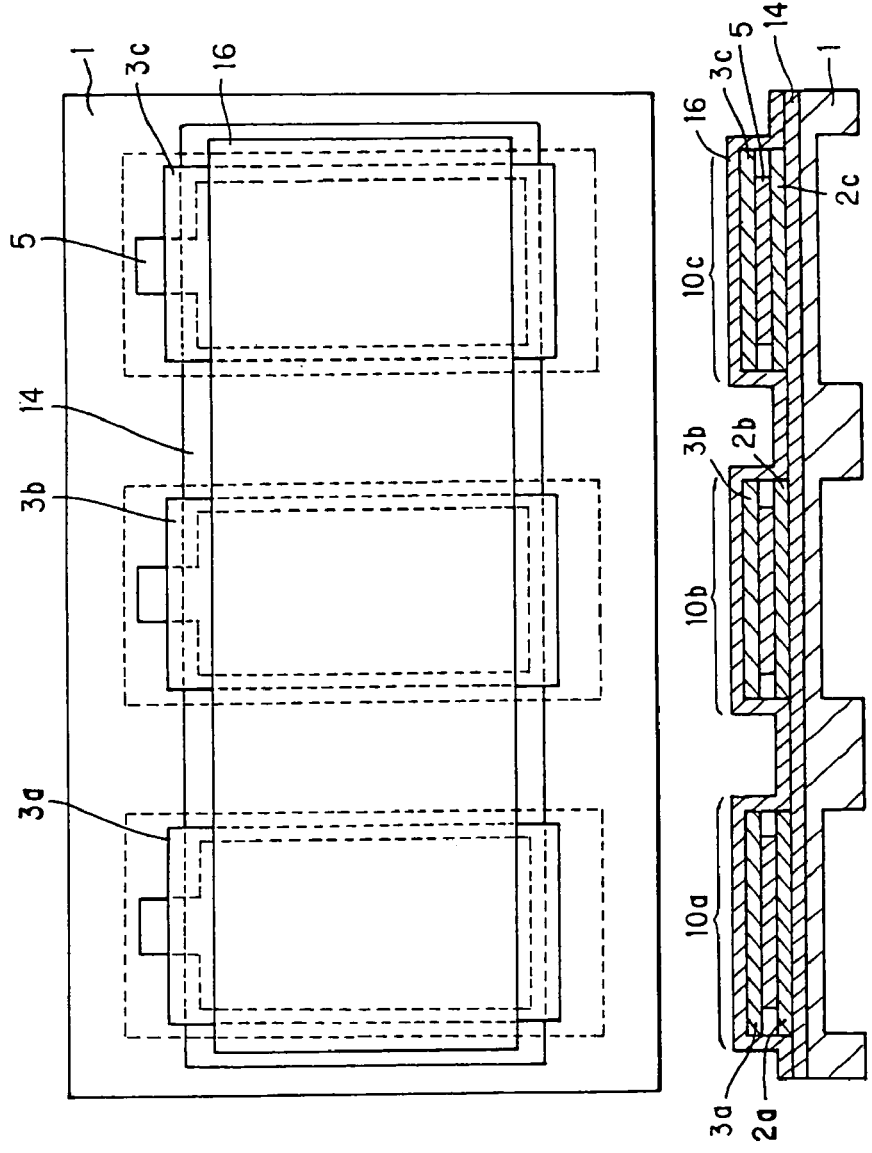
FIGS. 5(a) and 5(b) show diagrams schematically showing still another embodiment of a piezoelectric/electrostrictive film type device of the present invention.

Moreover, when the substrate 1 is shared by a plurality of piezoelectric device units 10a to 10c as shown in FIGS. 5(a), 5(b), an electrode 14 of the lowermost layer and an electrode 16 of an uppermost layer in the respective piezoelectric device units 10a to 10c are shared by the respective piezoelectric device units 10a to 10c, and the integral electrode 14 may be disposed in a region corresponding to piezoelectric/electrostrictive portions 2a to 2c, 3a to 3c. The integral electrode 14 does not have to have the shape corresponding to that of each of the piezoelectric/electrostrictive portions 2a to 2c, 3a to 3c, and the positioning during the forming of the electrode is facilitated.

Figure 6:
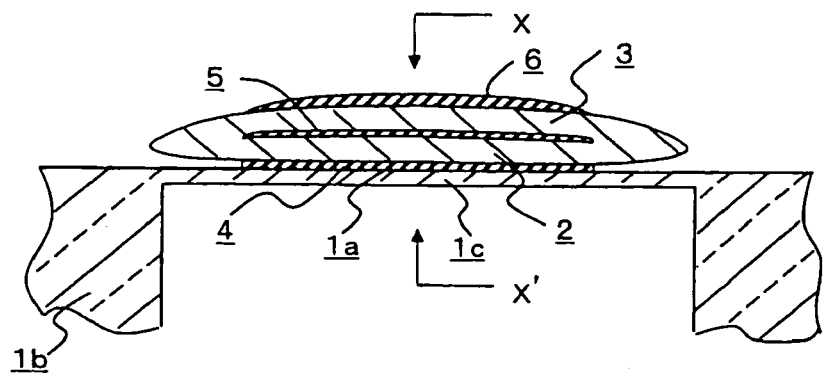
FIG. 6 is a sectional view showing one more specific example of the embodiment shown in FIG. 3.
Figure 9:
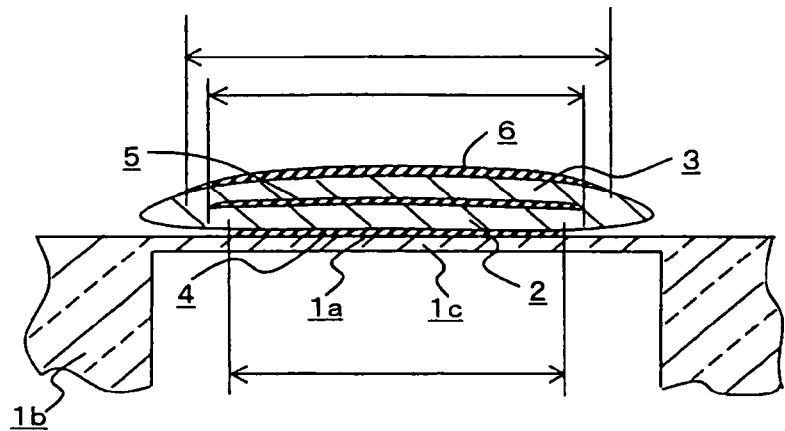
FIG. 9 is a sectional view showing still another more specific example of the embodiment shown in FIG. 3.
Figure 12A:
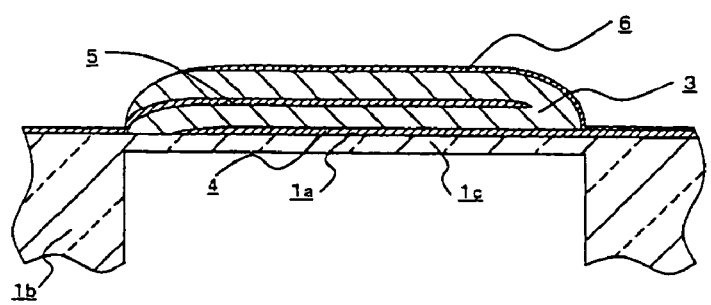
FIG. 12(a) is an X–X' sectional view of FIG. 6.
Figure 12B:
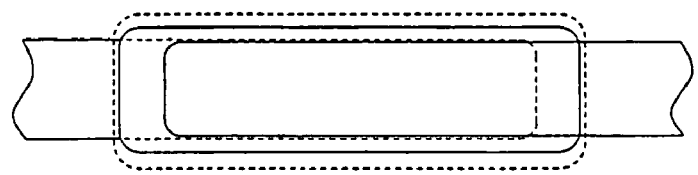
FIG. 12(b) is a top plan view of FIG. 6.

In the present invention, the material of the electrode is at least one metal selected from the group consisting of platinum, palladium, rhodium, gold, silver, and an alloy of these. Above all, platinum or an alloy containing platinum as the major component is preferable because the heat resistance is high during the thermal treatment for the piezoelectric/electrostrictive portion. The dimension of the electrode is not especially limited. However, for example, as shown in FIGS. 6 and 12(a), 12(b), the respective electrodes 4, 5, 6 may have the same dimension, and the electrodes 4, 5, 6 may also be disposed in positions corresponding to one another in the same range in the thickness direction. As shown in FIG. 9, the respective electrodes 4, 5, 6 may also preferably be disposed in a broader range including ranges corresponding to the electrodes positioned in the lower layer in order from the electrode 4 positioned in the lowermost layer. With this constitution, the piezoelectric/electrostrictive portion positioned in the upper layer can be strained more largely than that positioned in the lower layer. Therefore, a bend efficiency is enhanced, and the flexural displacement can more effectively be exhibited.

Figure 10:
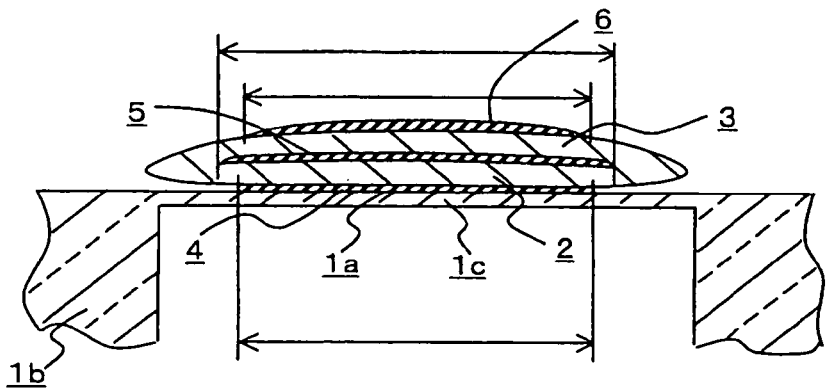
FIG. 10 is a sectional view showing still another more specific example of the embodiment shown in FIG. 3.
Figure 11:
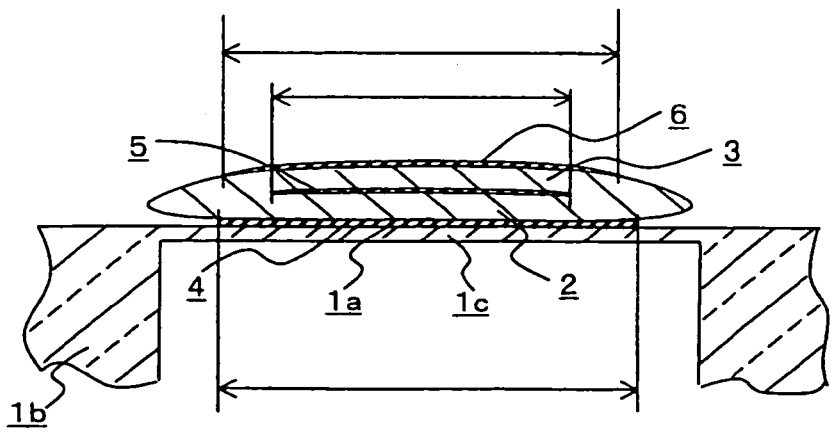
FIG. 11 is a sectional view showing yet another more specific example of the embodiment shown in FIG. 3.

Additionally, when a large flexural displacement is obtained by an increase of a driving voltage of a multilayered piezoelectric device, the electrode 5 in an intermediate position is preferably disposed in a range broader than that of the electrodes 4, 6 positioned in the lower and upper layers as shown in FIG. 10. Alternatively, as shown in FIG. 11, the electrode 5 in the intermediate position is preferably disposed in a range smaller than that of the electrodes 4, 6. With this constitution, the electric field is hardly added to the vicinity of the end (in a short direction) in which the layers of the piezoelectric portions 2, 3 easily become thin, and the dielectric breakdown of the piezoelectric/electrostrictive portions 2, 3 can be avoided. It is to be noted that a broad/narrow difference in the range in which the electrodes are disposed is preferably optimized in consideration of an electric field distribution. For example, the ratio of the area (area of the forming surface) in which the electrode is disposed is preferably 0.5 to 2, further preferably 0.67 to 1.5, especially preferably 0.83 to 1.2 between the electrodes 4, 5 (or 5, 6) disposed adjacent to each other via the piezoelectric/electrostrictive portion 2 (or 3).

In the present invention, the thickness of the electrode is preferably 15 μm or less, further preferably 5 μm or less. When the thickness exceeds 15 μm, the electrode functions as an alleviating layer, and the flexural displacement is sometimes reduced.

Next, an embodiment of the present invention (fourth aspect of the invention) will be described. The piezoelectric/electrostrictive porcelain composition of the embodiment of the fourth aspect of the invention contains: a $PbMg_{1/3}Nb_{2/3}O_3$—$PbZrO_3$—$PbTiO_3$ ternary solid solution system composition as the major component; 0.05 to 3.0 wt % of NiO; and 2.0 to 22.0 mol % of Si with respect to the total number of moles of Mg and Ni.

Since the piezoelectric/electrostrictive porcelain composition of the present embodiment contains a predetermined ratio of NiO, the hetero-phase can be inhibited from being formed in the piezoelectric/electrostrictive portion formed by sintering piezoelectric/electrostrictive porcelain composition, and the ratio accounted for the perovskite phase contributing to a electric field induced strain is large. Therefore, it is possible to form the piezoelectric/electrostrictive portion which constitutes the small-sized piezoelectric/electrostrictive film type device having the high characteristics, which is dense, and which has remarkably high piezoelectric characteristics as described above. Moreover, since a predetermined ratio of Si is contained, it is possible to manufacture a dense piezoelectric/electrostrictive material (bulk material) having the high piezoelectric characteristics by sintering at a temperature lower than that of the conventional piezoelectric/electrostrictive porcelain composition which does not contain Si. Furthermore, since the piezoelectric/electrostrictive material (bulk material) can be manufactured at a lower sintering temperature, the composition is also superior in equipment, cost, or the like.

It is to be noted that to prevent the hetero-phase formation by the sintering, the NiO content is preferably 0.10 to 2.5 wt %, more preferably 0.15 to 2.0 wt %. To enhance denseness and to prevent the piezoelectric characteristics deterioration of the obtained piezoelectric/electrostrictive portion, the Si content is preferably 3.0 to 21.0 mol %, more preferably 3.9 to 19.8 mol % with respect to the total number of moles of Mg and Ni.

Moreover, the piezoelectric/electrostrictive porcelain composition of the present invention preferably contains the $PbMg_{1/3}Nb_{2/3}O_3$—$PbZrO_3$—$PbTiO_3$ ternary solid solution system composition represented by the following general formula (17) as the major component because a piezoelectric/electrostrictive portion having higher piezoelectric characteristics can be formed.

$$Pb_x(Mg_{y/3}Nb_{2/3})_aTi_bZr_cO_3 \quad (17),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

Next, an embodiment of the present invention (fifth aspect of the invention) will be described. The piezoelectric/electrostrictive porcelain composition of the embodiment of the fifth aspect of the invention comprises: a $Pb(Mg, Ni)_{1/3}Nb_{2/3}O_3$—$PbZrO_3$—$PbTiO_3$ ternary solid solution system composition as the major component; and 4.0 to 37.0 mol % of Si with respect to the total number of moles of Mg and Ni.

In the piezoelectric/electrostrictive porcelain composition of the present embodiment, since a part of Mg is replaced with Ni, the formation of the hetero-phase can be suppressed in the piezoelectric/electrostrictive portion formed by sintering the composition, and the ratio accounted for the perovskite phase contributing to the electric field induced strain is large. Therefore, it is possible to form the piezoelectric/electrostrictive portion which constitutes the small-sized piezoelectric/electrostrictive film type device having the high characteristics, which is dense, and which has the remarkably high piezoelectric characteristics as described above. Moreover, since the piezoelectric/electrostrictive porcelain composition of the present embodiment contains a predetermined ratio of Si, it is possible to manufacture the dense piezoelectric/electrostrictive material (bulk material) having the high piezoelectric characteristics by sintering at a temperature lower than that of the conventional piezoelectric/electrostrictive porcelain composition which does not contain Si. Furthermore, since the piezoelectric/electrostrictive material (bulk material) can be manufactured at a lower sintering temperature, the composition is also superior in equipment, cost, or the like.

It is to be noted that to enhance denseness and to prevent the piezoelectric characteristics deterioration of the obtained piezoelectric/electrostrictive portion, the Si content is preferably 5.5 to 34.0 mol %, more preferably 6.6 to 32.8 mol % with respect to the total number of moles of Mg and Ni.

Moreover, the piezoelectric/electrostrictive porcelain composition of the present invention (fifth aspect of the invention) preferably contains the $Pb(Mg, Ni)_{1/3}Nb_{2/3}O_3$—$PbZrO_3$—$PbTiO_3$ ternary solid solution system composition represented by the following general formula (18) as the major component because a piezoelectric/electrostrictive portion having higher piezoelectric characteristics can be formed.

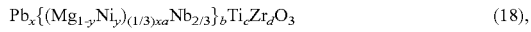

$$Pb_x\{(Mg_{1-y}Ni_y)_{(1/3)xa}Nb_{2/3}\}_bTi_cZr_dO_3 \quad (18),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

Next, the methods of manufacturing the piezoelectric/electrostrictive film type device of the present invention (first to third aspects of the invention) and the piezoelectric/electrostrictive porcelain composition of the present invention (fourth and fifth aspects of the invention) will be described. First, the piezoelectric/electrostrictive porcelain composition is formed on the ceramic substrate or the electrode formed on the surface of the substrate. The method of forming the electrode, for example, there can be mentioned such as an ion beam, sputtering, vacuum deposition, PVD, ion plating, CVD, plating, screen printing, spraying, dipping, and the like. Above all, the sputtering method or the screen printing method is preferable in bonding properties between the substrate and the piezoelectric/electrostrictive portion. The formed electrode can be integrated with the substrate and/or the piezoelectric/electrostrictive portion by the thermal treatment at about 1000 to 1400° C. This thermal treatment may be carried out when the electrode has been formed before the piezoelectric material is formed, or may also collectively be carried out after a desired formed member is prepared.

The piezoelectric/electrostrictive porcelain composition may be prepared by calcining and grinding a mixed raw material obtained by mixing various raw materials so as to correspond to a desired composition. Alternatively, the composition may be prepared by a method in which the mixed raw material is calcined, NiO and $SiO_2$ are added, and the material is further calcined and grinded. A method of preparing the piezoelectric/electrostrictive porcelain composition containing the $PbMg_{1/3}Nb_{2/3}O_3$—$PbZrO_3$—$PbTiO_3$ ternary solid solution system composition as the major component will specifically be described hereinbelow as a representative example.

First, single elements such as Pb, Mg, Nb, Zr, and Ti, oxides of these elements (PbO, $Pb_3O_4$, MgO, $Nb_2O_5$, $TiO_2$, $ZrO_2$ and the like), carbonates ($MgCO_3$ and the like), and compounds ($MgNb_2O$ and the like) containing a plurality of elements are mixed in such a manner that the content of each element indicates a composition ratio of a desired piezoelectric/electrostrictive porcelain composition to prepare a mixed raw material which is to serve as the major component of the piezoelectric/electrostrictive porcelain composition.

Next, after calcining the mixed raw material at 750 to 1300° C., desired amounts of NiO and $SiO_2$ are added thereto, and the material is mixed and again calcined at 750 to 1300° C., and thereby the piezoelectric/electrostrictive porcelain composition can be obtained. In the obtained piezoelectric/electrostrictive porcelain composition, with regard to a diffraction strength by an X-ray diffractometry, a ratio of a strongest diffraction line of a pyrochlore phase to that of the perovskite phase is preferably 5% or less, further preferably 2% or less.

The obtained piezoelectric/electrostrictive porcelain composition is grinded by the use of general grinder such as a ball mill, an attriter, and a bead mill to form a powder having a desired particle diameter. In this case, an average particle diameter of the powder is preferably 0.1 to 1.0 μm, further preferably 0.3 to 0.7 μm.

It is to be noted that the powder particle diameter may also be adjusted the grinded powder by the thermal treatment at 400 to 750° C. In this case, finer particles are preferable because the finer particles are integrated with the other particles to form the powder having the uniform particle diameter, and the piezoelectric/electrostrictive portion having the uniform particle diameter can be obtained. The piezoelectric/electrostrictive porcelain composition may also be prepared, for example, by an alkoxide method or a coprecipitation method.

On the other hand, the piezoelectric/electrostrictive porcelain composition containing the $Pb(Mg, Ni)_{1/3}Nb_{2/3}O_3$—$PbZrO_3$—$PbTiO_3$ ternary solid solution system composition as the major component is obtained in the same manner as in the case of the piezoelectric/electrostrictive porcelain composition containing the $PbMg_{1/3}Nb_{2/3}O_3$—$PbZrO_3$—$PbTiO_3$ ternary solid solution system composition except as the main component that the mixed raw material obtained by mixing the single elements such as Pb, Mg, Ni, Nb, Zr, and Ti, oxides of these elements (PbO, $Pb_3O_4$, MgO, NiO, $Nb_2O_5$, $TiO_2$, $ZrO_2$ and the like), carbonates ($MgCO_3$ and the like), and the compounds ($MgNb_2O$ and the like) containing a plurality of elements in such a manner that the content of each element such as Pb, Mg, Ni, Nb, Zr, and Ti indicates a composition ratio of a desired piezoelectric/electrostrictive porcelain composition is calcined at a time.

The method of forming the obtained piezoelectric/electrostrictive porcelain composition on the surface of the substrate, for example, there can be mentioned such as screen printing, spraying, dipping, and the like. Above all, the screen printing is preferable in that the composition layer can easily and continuously be formed in a high-precision shape and thickness. Next, the electrode is formed on the layer formed of the piezoelectric/electrostrictive porcelain composition formed on the substrate surface in the same manner as described above. It is to be noted that the piezoelectric/electrostrictive porcelain composition and the electrode may successively be formed further on the electrode as necessary.

Thereafter, the obtained formed member is integrally thermally treated. The piezoelectric/electrostrictive portion can be solidly attached to the substrate directly or via the electrode by the thermal treatment. It is to be noted that the thermal treatment does not have to be necessarily carried out integrally, and may also successively be carried out every time one layer is formed. However, from the viewpoint of a production efficiency, it is preferred that the member be thermally treated integrally in the state that the electrode is also included.

A thermal treatment temperature is at preferably 1000 to 1400° C., further preferably 1100 to 1350° C. When the temperature is less than 1000° C., the solidly attaching between the substrate or the electrode and the piezoelectric/electrostrictive portion is incomplete, and the denseness of the piezoelectric/electrostrictive portion is insufficient in some case. With the temperature exceeding 1400° C., since an evaporated amount of Pb, Ni in the piezoelectric/electrostrictive porcelain composition increases, it is difficult to form the piezoelectric/electrostrictive portion having a desired composition. A maximum temperature holding time at the time of the thermal treatment is preferably ten minutes or more and ten hours or less, further preferably 20 minutes or more and four hours or less. When the maximum temperature holding time is less than ten minutes, the piezoelectric/electrostrictive portion is prone to be insufficiently densified, and the desired characteristics cannot be obtained in some case. With the maximum temperature holding time exceeding ten hours, even when the thermal treatment is carried out under an atmosphere control, the total evaporated amount of Pb or Ni increases, and disadvantages such as the drop of the piezoelectric characteristics or the increase of the dielectric breakdown are caused.

To form the piezoelectric/electrostrictive portion in a state in which the Ni content is controlled at a desired amount, the thermal treatment is preferably carried out while a material for the atmosphere control having substantially the same Ni content as that of the formed piezoelectric material coexists. It is to be noted that the content of another component of the material for atmosphere control is also preferably substantially the same as that of the formed piezoelectric/electrostrictive porcelain composition so as to prevent the other component from being evaporated and to securely obtain the piezoelectric/electrostrictive portion having the desired composition.

Thereafter, a polarization treatment is carried out under appropriate conditions; and at that time the device is preferably heated as known to carry out the polarization treatment. A heating temperature for the treatment is preferably at 40 to 200° C. depending on a Curie point of a piezoelectric/electrostrictive member.

EXAMPLES

The present invention will hereinafter more specifically be described in accordance with examples, but the present invention is not limited to these examples. It is to be noted that flexural displacement ratio and electric field induced strain were measured and evaluated as follows with respect to the manufactured piezoelectric/electrostrictive film type device and the piezoelectric/electrostrictive material constituting the bulk material.

(Flexural Displacement Ratio)

The flexural displacement (μm) caused during the application of the voltage so as to obtain an electric field of 4 kV/mm between the upper and the lower electrodes was measured by a laser displacement meter, and the flexural displacement of each sample was measured/calculated as a flexural displacement ratio (%) assuming that the flexural displacement of the piezoelectric/electrostrictive film type device of Comparative Example 1 described later was 100%.

(Electric Field Induced Strain)

The piezoelectric/electrostrictive material constituting the bulk material was cut out as a sample with a shape having a dimension of 12×3×1 mm, and the 12×3 mm electrodes of Ag were formed on the both surfaces of the sample. A strain gauge was attached to the electrode, and a voltage of 4 kV/mm was applied between the electrodes to measure a strain in a direction vertical to the electric field as an electric field induced strain (ppm).

Examples 1 to 3, Comparative Examples 1 to 3

On a $ZrO_2$ substrate stabilized by $Y_2O_3$, a lower electrode formed of Pt having the same dimensional shape as that of the $ZrO_2$ substrate and having a thickness of 3 μm by the screen printing method was formed, and thermally treated to be integrated with the substrate. Next, further on the electrode, the piezoelectric/electrostrictive porcelain composition containing $Pb_{1.00}(Mg_{1/3}Nb_{2/3})_{0.20}Ti_{0.43}Zr_{0.37}O_3$ as the major component and containing 1.0 wt % of NiO and having an Si content (Si/(Ni+Mg)) (mol %) shown in Table 1 with respect to the total number of moles of Ni and Mg was formed in a thickness of 7 μm by the screen printing method. Further a gold-made upper electrode was formed thereon by the screen printing method, and they were thermally treated to manufacture the piezoelectric/electrostrictive film type device (Examples 1 to 3, Comparative Examples 1 to 3). It is to be noted that all the thermally treated piezoelectric/electrostrictive portions has a thickness of 5 μm. Measurement results of the flexural displacement ratio are shown in Table 1.

TABLE 1

| | Si/(Ni + Mg) (mol %) | Flexural displacement ratio (%) |
|---|---|---|
| Comparative Example 1 | 0 | 100 |
| Comparative Example 2 | 1 | 106 |
| Example 1 | 3.9 | 159 |
| Example 2 | 9.9 | 181 |
| Example 3 | 19.8 | 151 |
| Comparative Example 3 | 29.6 | 111 |

As shown in Table 1, when a value of Si/(Ni+Mg) (mol %) is small (Comparative Examples 1, 2), the composition is not easily densified, and the flexural displacement is apparently reduced. On the other hand, it has also been revealed that the flexural displacement is reduced also in the case with an excessively large value of Si/(Ni+Mg) (mol %) (Comparative Example 3). It is supposed that Si forms a hetero-phase with Pb, and the flexural displacement drops.

Examples 4 to 6

The piezoelectric/electrostrictive film type device (Examples 4 to 6) was manufactured in the same manner as in Examples 1 to 3, Comparative Examples 1 to 3 except that the piezoelectric/electrostrictive porcelain composition having a composition shown in Table 2 and containing 6.5 mol % Si content (Si/(Ni+Mg)) with respect to the total number of moles of Ni and Mg was used. It is to be noted that all the thermally treated piezoelectric/electrostrictive portions had a thickness of 5 μm. The measurement results of the flexural displacement ratio are shown in Table 2.

TABLE 2

| | Piezoelectric/electrostrictive porcelain composition | Flexural displacement ratio (%) |
|---|---|---|
| Example 4 | $Pb_{1.00}(Mg_{1/3}Nb_{2/3})_{0.375}Ti_{0.475}Zr_{0.15}O_3$ | 135 |
| Example 5 | $Pb_{1.00}(Mg_{1/3}Nb_{2/3})_{0.375}Ti_{0.375}Zr_{0.25}O_3$ | 156 |
| Example 6 | $Pb_{1.00}(Mg_{1/3}Nb_{2/3})_{0.375}Ti_{0.275}Zr_{0.35}O_3$ | 131 |

As shown in Table 2, it is apparent that the flexural displacement of Example 5 is higher than that of Examples 4, 6. Therefore, it is seen that there is a certain optimum range of numeric value with regard to the composition ratio of three components ($PbMg_{1/3}Nb_{2/3}O_3$, $PbZrO_3$, and $PbTiO_3$) constituting the piezoelectric/electrostrictive porcelain composition.

Examples 7 to 9, Comparative Examples 4, 5

The piezoelectric/electrostrictive film type device (Examples 7 to 9, Comparative Examples 4, 5) was manufactured in the same manner as in Examples 1 to 3 and Comparative Examples 1 to 3 described above except for the use of the piezoelectric/electrostrictive porcelain composition including the major component of $Pb_{1.00}\{(Mg_{0.87}Ni_{0.13})_{1/3}Nb_{2/3}\}_{0.20}Ti_{0.43}Zr_{0.37}O_3$ with the Si content (Si/(Ni+Mg)) with respect to the total number of moles of Ni and Mg at a ratio (mol %) shown in Table 3. It is to be noted that all the thermally treated piezoelectric/electrostrictive portions had a thickness of 5 μm. The measurement results of the flexural displacement ratio are shown in Table 3.

TABLE 3

| | Si/(Ni + Mg) (mol %) | Flexural displacement ratio (%) |
|---|---|---|
| Comparative Example 4 | 1.6 | 104 |
| Example 7 | 6.6 | 152 |
| Example 8 | 16.4 | 173 |
| Example 9 | 32.8 | 142 |
| Comparative Example 5 | 49.2 | 115 |

As shown in Table 3, it is apparent that, when the value of Si/(Ni+Mg) (mol %) is small (Comparative Example 4), the composition is not easily densified, and therefore, the flexural displacement is reduced. On the other hand, it has also been revealed that also with an excessively large value of Si/(Ni+Mg) (mol %) (Comparative Example 5), the flexural displacement is reduced. It is supposed that Si forms a hetero-phase with Pb, and the flexural displacement drops.

Examples 10 to 12

The piezoelectric/electrostrictive film type device (Examples 10 to 12) was manufactured in the same manner as in Examples 7 to 9, Comparative Examples 4, 5 except for the use of the piezoelectric/electrostrictive porcelain composition having a composition shown in Table 4 and containing 9.4 mol % Si content (Si/(Ni+Mg)) with respect to the total number of moles of Ni and Mg. It is to be noted that all the thermally treated piezoelectric/electrostrictive portions had a thickness of 5 μm. The measurement results of the flexural displacement ratio are shown in Table 4.

TABLE 4

| | Piezoelectric/electrostrictive porcelain composition | Flexural displacement ratio (%) |
|---|---|---|
| Example 10 | $Pb_{1.00}\{(Mg_{0.87}Ni_{0.13})_{1/3}Nb_{2/3}\}_{0.375}Ti_{0.475}Zr_{0.15}O_3$ | 133 |
| Example 11 | $Pb_{1.00}\{(Mg_{0.87}Ni_{0.13})_{1/3}Nb_{2/3}\}_{0.375}Ti_{0.375}Zr_{0.25}O_3$ | 162 |
| Example 12 | $Pb_{1.00}\{(Mg_{0.87}Ni_{0.13})_{1/3}Nb_{2/3}\}_{0.375}Ti_{0.275}Zr_{0.35}O_3$ | 141 |

As shown in Table 4, it is apparent that the flexural displacement of Example 11 is higher than that of Examples 10, 12. Therefore, it is seen that there is a certain optimum range of numeric value with regard to the composition ratio of three components ($Pb(Mg,Ni)_{1/3}Nb_{2/3}O_3$, $PbZrO_3$, and $PbTiO_3$) constituting the piezoelectric/electrostrictive porcelain composition.

Example 13

On a $ZrO_2$ substrate stabilized by $Y_2O_3$, a lower electrode formed of Pt having the same dimensional shape as that of the $ZrO_2$ substrate and having a thickness of 3 μm by the screen printing method was formed, and thermally treated to be integrated with the substrate. Next, further on the electrode, the piezoelectric/electrostrictive porcelain composition containing $Pb_{1.00}(Mg_{1/3}Nb_{2/3})_{0.20}Ti_{0.43}Zr_{0.37}O_3$ as the major component and containing 1.0 wt % of NiO and containing 9.9 mol % Si content (Si/(Ni+Mg)) with respect to the total number of moles of Ni and Mg was formed in a thickness of 7 μm by the screen printing method. Next, on the formed composition, a platinum-made intermediate electrode was formed by the screen printing method, and on the electrode the same piezoelectric/electrostrictive porcelain composition as that of the first layer mentioned above was formed in a thickness of 7 μm by the screen printing method. Further on the formed composition, the gold-made upper electrode was formed by the screen printing method, and they were thermally treated to manufacture the piezoelectric/electrostrictive film type device (Example 13). It is to be noted that each of the thermally treated piezoelectric/electrostrictive portions had a thickness of 5 μm.

When the flexural displacement ratio of the piezoelectric/electrostrictive film type device of Example 13 was measured, a remarkably high numeric value of 188% was indicated.

Example 14

The piezoelectric/electrostrictive film type device (Example 14) was manufactured in the same manner as in Example 13 except for the use of the piezoelectric/electrostrictive porcelain composition containing $Pb_{1.00}\{(Mg_{0.87}Ni_{0.13})_{1/3}Nb_{2/3}\}_{0.20}Ti_{0.43}Zr_{0.37}O_3$ as the major component and containing 16.4 mol % Si content (Si/(Ni+Mg)) with respect to the total number of moles of Ni and Mg. It is to be noted that each of the thermally treated piezoelectric/electrostrictive portion had a thickness of 5 μm.

When the flexural displacement ratio of the piezoelectric/electrostrictive film type device of Example 14 was measured, a remarkably high numeric value of 191% was indicated.

Examples 15 to 17

The piezoelectric/electrostrictive film type device (Examples 15 to 17) was manufactured in the same manner as in Examples 1 to 3, Comparative Examples 1 to 3 except that the piezoelectric/electrostrictive porcelain composition containing 9.9 mol % Si content (Si/(Ni+Mg)) with respect to the total number of moles of Ni and Mg was used and the piezoelectric/electrostrictive porcelain composition was formed so as to obtain the thickness of the piezoelectric/electrostrictive portion as shown in Table 5. The measurement results of the flexural displacement ratio are shown in Table 5.

TABLE 5

|  | Piezoelectric/electrostrictive thickness (μm) | Flexural displacement ratio (%) |
| --- | --- | --- |
| Example 15 | 0.3 | 142 |
| Example 16 | 5 | 181 |
| Example 17 | 50 | 156 |

As shown in Table 5, it is apparent that the flexural displacement of Example 16 is higher as compared with Examples 15, 17. Therefore, it is seen that there is a certain optimum range of numeric value with regard to the thickness of the piezoelectric/electrostrictive portion to maximize the flexural displacement.

Example 18

On a $ZrO_2$ substrate stabilized by $Y_2O_3$, a lower electrode formed of Pt having the same dimensional shape as that of the $ZrO_2$ substrate and having a thickness of 3 μm by the screen printing method was formed and thermally treated to be integrated with the substrate. Next, further on the electrode, the piezoelectric/electrostrictive porcelain composition containing $Pb_{1.00}\{(Mg_{0.87}Ni_{0.13})_{1/3}Nb_{2/3}\}_{0.20}Ti_{0.43}Zr_{0.37}O_3$ as the major component and containing 16.4 mol % Si content (Si/(Ni+Mg)) with respect to the total number of moles of Ni and Mg was formed in a thickness of 7 μm by the screen printing method. Next, on the formed composition, the platinum-made intermediate electrode was formed by the screen printing method, and on the electrode the piezoelectric/electrostrictive porcelain composition containing $Pb_{1.00}(Mg_{1/3}Nb_{2/3})_{0.20}Ti_{0.43}Zr_{0.37}O_3$ as the major component and containing 1.0 wt % of NiO and containing 9.9 mol % Si content (Si/(Ni+Mg)) with respect to the total number of moles of Ni and Mg was formed in a thickness of 7 μm by the screen printing method. Further on the formed composition, the gold-made upper electrode formed of Au was formed by the screen printing method, and they were thermally treated to manufacture the piezoelectric/electrostrictive film type device (Example 18). It is to be noted each of thermally treated piezoelectric/electrostrictive portions had a thickness of 5 μm.

When the flexural displacement ratio of the piezoelectric/electrostrictive film type device of Example 18 was measured, a remarkably high numeric value of 193% was indicated.

Example 19

The piezoelectric/electrostrictive porcelain composition (Example 19) containing the major component of $Pb_{1.00}(Mg_{1/3}Nb_{2/3})_{0.20}Ti_{0.43}Zr_{0.37}O_3$ and containing 1.0 wt % of NiO and containing 9.9 mol % Si content (Si/(Ni+Mg)) with respect to the total number of moles of Ni and Mg was sintered (thermally treated) at each sintering temperature shown in Table 6 to manufacture the piezoelectric/electrostrictive material (bulk material). The measurement results of the electric field induced strain are shown in Table 6.

Example 20

The piezoelectric/electrostrictive porcelain composition (Example 20) containing the major component of $Pb_{1.00}\{(Mg_{0.87}Ni_{0.13})_{1/3}Nb_{2/3}\}_{0.20}Ti_{0.43}Zr_{0.37}O_3$ and containing 16.4 mol % Si content (Si/(Ni+Mg)) with respect to the total number of moles of Ni and Mg was sintered (thermally treated) at each sintering temperature shown in Table 6 to manufacture the piezoelectric/electrostrictive material (bulk material). The measurement results of the electric field induced strain are shown in Table 6.

Comparative Example 6

The piezoelectric/electrostrictive porcelain composition (Comparative Example 6) constituted of $Pb_{1.00}(Mg_{1/3}Nb_{2/3})_{0.20}Ti_{0.43}Zr_{0.37}O_3$ was sintered (thermally treated) at each sintering temperature shown in Table 6 to manufacture the piezoelectric/electrostrictive material (bulk material). The measurement results of the electric field induced strain are shown in Table 6.

TABLE 6

| | Firing temperature (° C.) | | | | |
|---|---|---|---|---|---|
| | 1100 | 1150 | 1200 | 1250 | 1300 |
| | Electric field induced strain (ppm) | | | | |
| Example 19 | 850 | 1000 | 1000 | 900 | 650 |
| Example 20 | 900 | 1250 | 1050 | 750 | 400 |
| Comparative Example 6 | — *1 | — *1 | 600 | 1000 | 850 |

*1 not densified

As shown in Table 6, when Si and Ni are not contained (Comparative Example 6), the electric field induced strain cannot be measured at a low sintering temperature (1150° C. or less). It is apparent that the dense piezoelectric/electrostrictive material (bulk material) can be manufactured only at a higher sintering temperature (1200° C. or more). On the other hand, it is apparent that even when the piezoelectric/electrostrictive porcelain composition of Examples 19, 20 is sintered at a comparatively low temperature, the sufficiently densified piezoelectric/electrostrictive material (bulk material) can be manufactured.

As described above, in the piezoelectric/electrostrictive film type device of the present invention, the piezoelectric/electrostrictive porcelain composition constituting the device is constituted of the predetermined ternary solid solution system composition containing a predetermined ratio of NiO and Si, and the piezoelectric/electrostrictive portion is solidly attached to the substrate directly or via the positive or negative electrode. Therefore, the piezoelectric/electrostrictive film type device is provided with a dense piezoelectric/electrostrictive portion having remarkably high piezoelectric characteristics and is superior in vibration transmitting properties between the substrate and the piezoelectric/electrostrictive portion.

Moreover, in the piezoelectric/electrostrictive film type device of the present invention, the piezoelectric/electrostrictive porcelain composition constituting the first and second piezoelectric/electrostrictive portions is constituted of the predetermined ternary solid solution system composition containing the predetermined ratio of NiO and Si. Therefore, the device is provided with the dense piezoelectric/electrostrictive portion having the remarkably high piezoelectric characteristics and is superior in the vibration transmitting properties between the substrate and the piezoelectric/electrostrictive portion. In addition, the piezoelectric/electrostrictive film type device of the present invention is suitable for an actuator, sensor, or the like because of the characteristics.

Furthermore, the piezoelectric/electrostrictive porcelain composition of the present invention contains the predetermined ternary solid solution system composition as the major component, and contains the predetermined ratio of NiO and Si. Therefore, the composition is suitable for the piezoelectric/electrostrictive porcelain composition for constituting the piezoelectric/electrostrictive film type device having the above-described characteristics, and the dense piezoelectric/electrostrictive material (bulk material) can be manufactured at a lower sintering temperature.

What is claimed is:

1. A piezoelectric/electrostrictive film type device comprising:
   a substrate formed of a ceramic,
   at least one piezoelectric/electrostrictive portion formed of a piezoelectric/electrostrictive porcelain composition on the substrate, and
   at least one pair of electrodes on the substrate, electrically connected to the piezoelectric/electrostrictive portion and including a positive electrode and a negative electrode,
   wherein the piezoelectric/electrostrictive porcelain composition contains a $PbMg_{1/3}Nb_{2/3}O_3$—$PbZrO_3$—$PbTiO_3$ ternary solid solution system composition as a major component, contains 0.05 to 3.0 wt % of NiO, and contains 2.0 to 22.0 mol % of Si with respect to the total number of moles of Mg and Ni, and
   the piezoelectric/electrostrictive portion is solidly attached onto the substrate directly or via the positive electrode or the negative electrode.

2. The piezoelectric/electrostrictive film type device according to claim 1, wherein the piezoelectric/electrostrictive porcelain composition comprises the $PbMg_{1/3}Nb_{2/3}O_3$—$PbZrO_3$—$PbTiO_3$ ternary solid solution system composition represented by the following general formula (1) as the major component:

$$Pb_x(Mg_{y/3}Nb_{2/3})_aTi_bZr_cO_3 \qquad (1),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

3. A piezoelectric/electrostrictive film type device comprising:
   a substrate formed of a ceramic,
   at least one piezoelectric/electrostrictive portion formed of a piezoelectric/electrostrictive porcelain composition on the substrate, and
   at least one pair of electrodes on the substrate, electrically connected to the piezoelectric/electrostrictive portion and including a positive electrode and a negative electrode,
   wherein the piezoelectric/electrostrictive porcelain composition contains a $Pb(Mg, Ni)_{1/3}Nb_{2/3}O_3$—$PbZrO_3$—$PbTiO_3$ ternary solid solution system composition as a major component, and contains 4.0 to 37.0 mol % of Si with respect to the total number of moles of Mg and Ni, and the piezoelectric/electrostrictive portion is solidly attached onto the substrate directly or via the positive electrode or the negative electrode.

4. The piezoelectric/electrostrictive film type device according to claim 3, wherein the piezoelectric/electrostrictive porcelain composition comprises the $Pb(Mg, Ni)_{1/3}Nb_{2/3}O_3$—$PbZrO_3$—$PbTiO_3$ ternary solid solution system composition represented by the following general formula (2) as the major component:

$$Pb_x\{(Mg_{1-y}Ni_y)_{(1/3)xa}Nb_{2/3}\}_bTi_cZr_dO_3 \qquad (2),$$

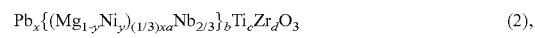

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

5. The piezoelectric/electrostrictive film type device according to claim 1, comprising: a plurality of the piezoelectric/electrostrictive portions; and a plurality of pairs of the electrodes, wherein the plurality of piezoelectric/electrostrictive portions are alternately held/stacked via the positive electrodes and the negative electrodes of the plurality of pairs of electrodes.

6. The piezoelectric/electrostrictive film type device according to claim 3, comprising: a plurality of the piezoelectric/electrostrictive portions; and a plurality of pairs of the electrodes, wherein the plurality of piezoelectric/electrostrictive portions are alternately held/stacked via the positive electrodes and the negative electrodes of the plurality of pairs of electrodes.

7. The piezoelectric/electrostrictive film type device according to claim 1, wherein the piezoelectric/electrostrictive portion has a thickness of 1 to 10 μm.

8. The piezoelectric/electrostrictive film type device according to claim 3, wherein the piezoelectric/electrostrictive portion has a thickness of 1 to 10 μm.

9. A piezoelectric/electrostrictive film type device comprising:
   a substrate formed of a ceramic,
   a plurality of piezoelectric/electrostrictive portions formed of a piezoelectric/electrostrictive porcelain composition on the substrate, and
   a plurality of pairs of electrodes on the substrate, each electrically connected to the piezoelectric/electrostrictive portion and each including a positive electrode and a negative electrode, the plurality of piezoelectric/electrostrictive portions being alternately held/stacked via the positive electrodes and the negative electrodes of the plurality of pairs of electrodes,
   wherein the piezoelectric/electrostrictive porcelain composition constituting at least one piezoelectric/electrostrictive portion (first piezoelectric/electrostrictive portion) contains a $Pb(Mg, Ni)_{1/3}Nb_{2/3}O_3$—$PbZrO_3$—$PbTiO_3$ ternary solid solution system composition as a major component, and contains 4.0 to 37.0 mol % of Si with respect to the total number of moles of Mg and Ni, and
   the piezoelectric/electrostrictive porcelain composition constituting at least one piezoelectric/electrostrictive portion (second piezoelectric/electrostrictive portion) contains a $PbMg_{1/3}Nb_{2/3}O_3$—$PbZrO_3$—$PbTiO_3$ ternary solid solution system composition as the major component, contains 0.05 to 3.0 wt % of NiO, and contains 2.0 to 22.0 mol % of Si with respect to the total number of moles of Mg and Ni.

10. The piezoelectric/electrostrictive film type device according to claim 9, wherein the piezoelectric/electrostrictive porcelain composition constituting the second piezoelectric/electrostrictive portion comprises the $PbMg_{1/3}Nb_{2/3}O_3$—$PbZrO_3$—$PbTiO_3$ ternary solid solution system composition represented by the following general formula (3) as the major component,
   the piezoelectric/electrostrictive porcelain composition constituting the first piezoelectric/electrostrictive portion comprises the $Pb(Mg, Ni)_{1/3}Nb_{2/3}O_3$—$PbZrO_3$—$PbTiO_3$ ternary solid solution system composition represented by the following general formula (4) as the major component, $$Pb_x(Mg_{y/3}Nb_{2/3})_aTi_bZr_cO_3 \quad (3),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

$$Pb_x\{(Mg_{1-y}Ni_y)_{(1/3)xa}Nb_{2/3}\}_bTi_cZr_dO_3 \quad (4),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

11. The piezoelectric/electrostrictive film type device according to claim 9, wherein each of the plurality of piezoelectric/electrostrictive portions has a thickness of 1 to 10 μm.

12. The piezoelectric/electrostrictive film type device according to claim 9, wherein an Ni content of the piezoelectric/electrostrictive porcelain composition constituting the piezoelectric/electrostrictive portion of a lowermost layer is smaller than that of the piezoelectric/electrostrictive porcelain composition constituting the piezoelectric/electrostrictive portion other than that of the lowermost layer.

13. A piezoelectric/electrostrictive porcelain composition comprising: a $PbMg_{1/3}Nb_{2/3}O_3$—$PbZrO_3$—$PbTiO_3$ ternary solid solution system composition as a major component; 0.05 to 3.0 wt % of NiO; and 2.0 to 22.0 mol % of Si with respect to the total number of moles of Mg and Ni.

14. The piezoelectric/electrostrictive porcelain composition according to claim 13, comprising: the $PbMg_{1/3}Nb_{2/3}O_3$—$PbZrO_3$—$PbTiO_3$ ternary solid solution system composition represented by the following general formula (5) as the major component:

$$Pb_x(Mg_{y/3}Nb_{2/3})_aTi_bZr_cO_3 \quad (5),$$

where $0.95 \leq x \leq 1.05$, $0.8 \leq y \leq 1.0$, and a, b, c are decimal numbers in a range surrounded with (a, b, c)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which a, b, c are coordinate axes (additionally, a+b+c=1.00).

15. A piezoelectric/electrostrictive porcelain composition comprising: a $Pb(Mg, Ni)_{1/3}Nb_{2/3}O_3$—$PbZrO_3$—$PbTiO_3$ ternary solid solution system composition as a major component; and 4.0 to 37.0 mol % of Si with respect to the total number of moles of Mg and Ni.

16. The piezoelectric/electrostrictive porcelain composition according to claim 15, comprising: the $Pb(Mg, Ni)_{1/3}Nb_{2/3}O_3$—$PbZrO_3$—$PbTiO_3$ ternary solid solution system composition represented by the following general formula (6) as the major component:

$$Pb_x\{(Mg_{1-y}Ni_y)_{(1/3)xa}Nb_{2/3}\}_bTi_cZr_dO_3 \quad (6),$$

where $0.95 \leq x \leq 1.05$, $0.05 \leq y \leq 0.20$, $0.90 \leq a \leq 1.10$, and b, c, d are decimal numbers in a range surrounded with (b, c, d)=(0.550, 0.425, 0.025), (0.550, 0.325, 0.125), (0.375, 0.325, 0.300), (0.100, 0.425, 0.475), (0.100, 0.525, 0.375), (0.375, 0.425, 0.200) in coordinates in which b, c, d are coordinate axes (additionally, (b+c+d)=1.000).

* * * * *